United States Patent [19]

Castro

[11] Patent Number: 5,031,142
[45] Date of Patent: Jul. 9, 1991

[54] RESET CIRCUIT FOR REDUNDANT MEMORY USING CAM CELLS

[75] Inventor: Hernan A. Castro, Shingle Springs, Calif.

[73] Assignee: Intel Corporation, Santa Clara, Calif.

[21] Appl. No.: 309,384

[22] Filed: Feb. 10, 1989

[51] Int. Cl.[5] .......................... G11C 15/04; G11C 7/00
[52] U.S. Cl. ...................................... 365/49; 365/200
[58] Field of Search ............. 365/49, 200, 218, 230.06; 367/449, 463

[56] References Cited

U.S. PATENT DOCUMENTS

| | | | |
|---|---|---|---|
| 3,633,175 | 1/1972 | Harper | 369/200 |
| 3,735,368 | 5/1973 | Beausoleil | 365/200 |
| 3,753,235 | 8/1973 | Daughton et al. | 365/200 |
| 3,753,244 | 8/1973 | Sumilas et al. | 365/200 |
| 4,051,354 | 9/1977 | Choate | 365/200 |
| 4,250,570 | 2/1981 | Tsang et al. | 365/200 |
| 4,358,833 | 11/1982 | Folmsbee et al. | 365/200 |
| 4,441,170 | 4/1984 | Folmsbee et al. | 365/200 |
| 4,862,417 | 8/1989 | List et al. | 365/200 |

OTHER PUBLICATIONS

ISSCC 88, Session X: Nonvolatile Memories, Feb. 18, 1988 pp. 120 and 121.

*Primary Examiner*—James W. Moffitt
*Assistant Examiner*—Jack A. Lane
*Attorney, Agent, or Firm*—Blakely, Sokoloff, Taylor & Zafman

[57] ABSTRACT

Modified CAMs are used to generate a reset signal to other redundant CAMs which provide decoding for accessing redundant memory. Because the redundant CAMs use a single UPROM, half-latch circuit, the redundant CAMs are capable of latching to the wrong logic state. Whenever signal conditions which can cause improper latch-up are present, at least one of the modified CAMs are affected due to their sensitivity. Then, the modified CAMs will generate a reset signal until the improper latch-up condition is removed.

11 Claims, 3 Drawing Sheets

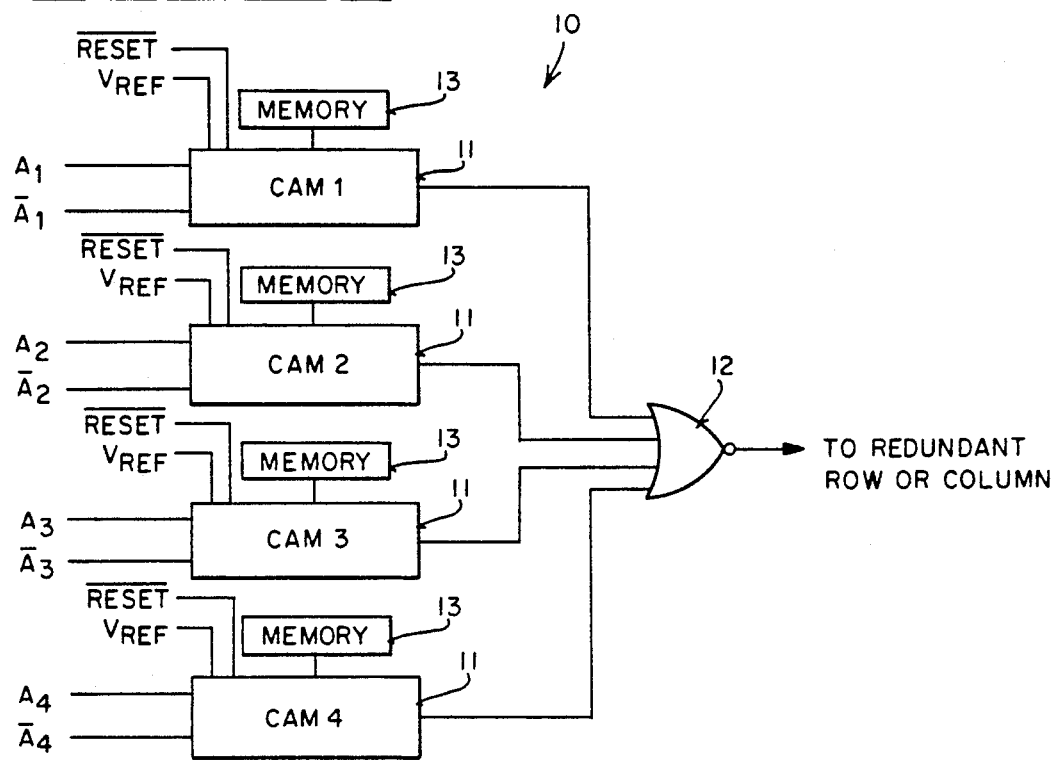
FIG_1
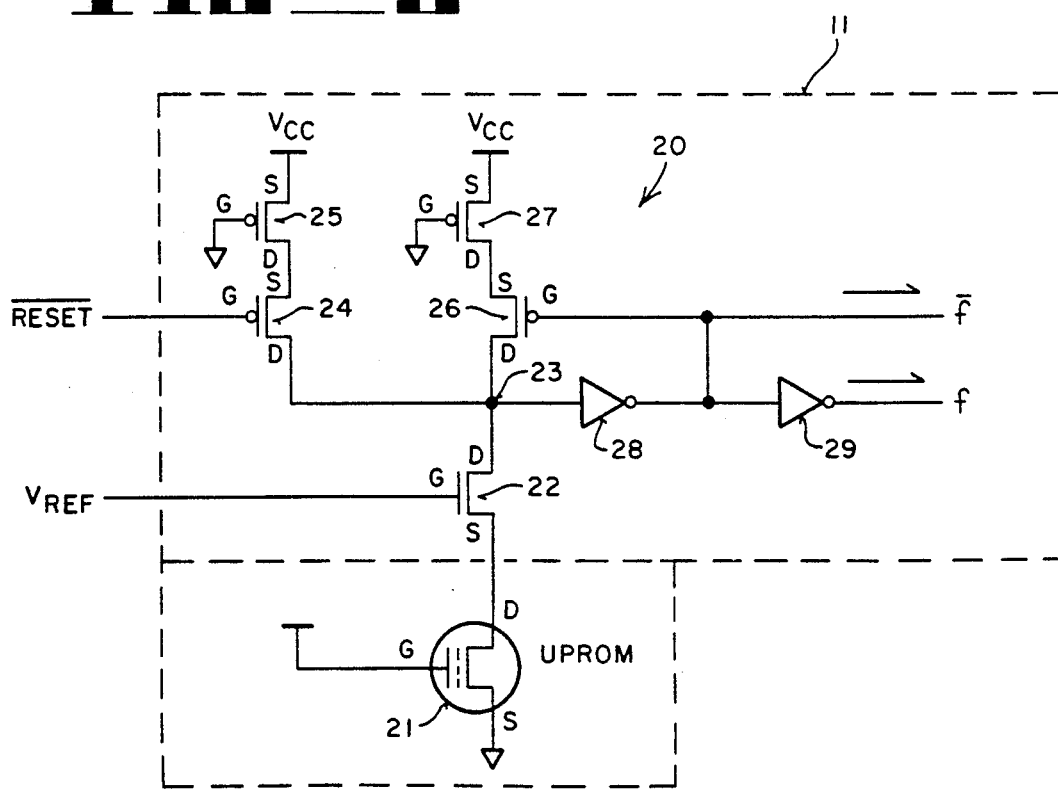
FIG_2

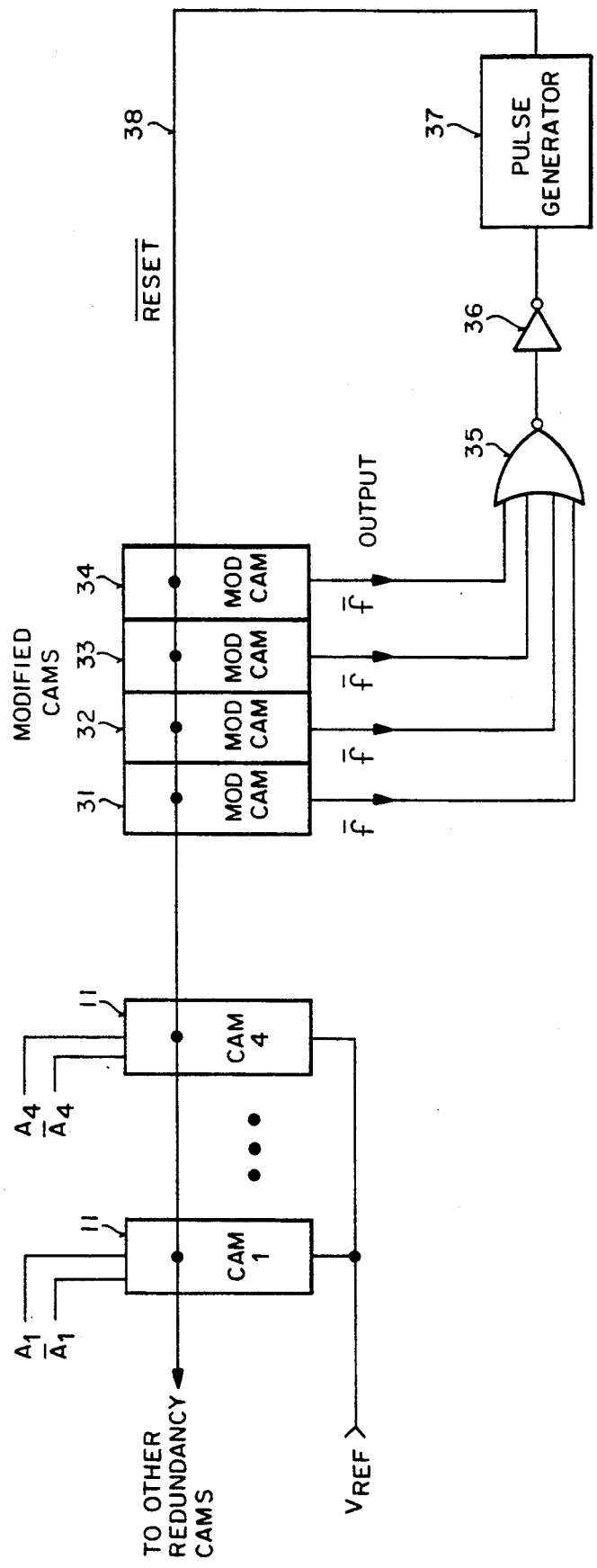
FIG._3

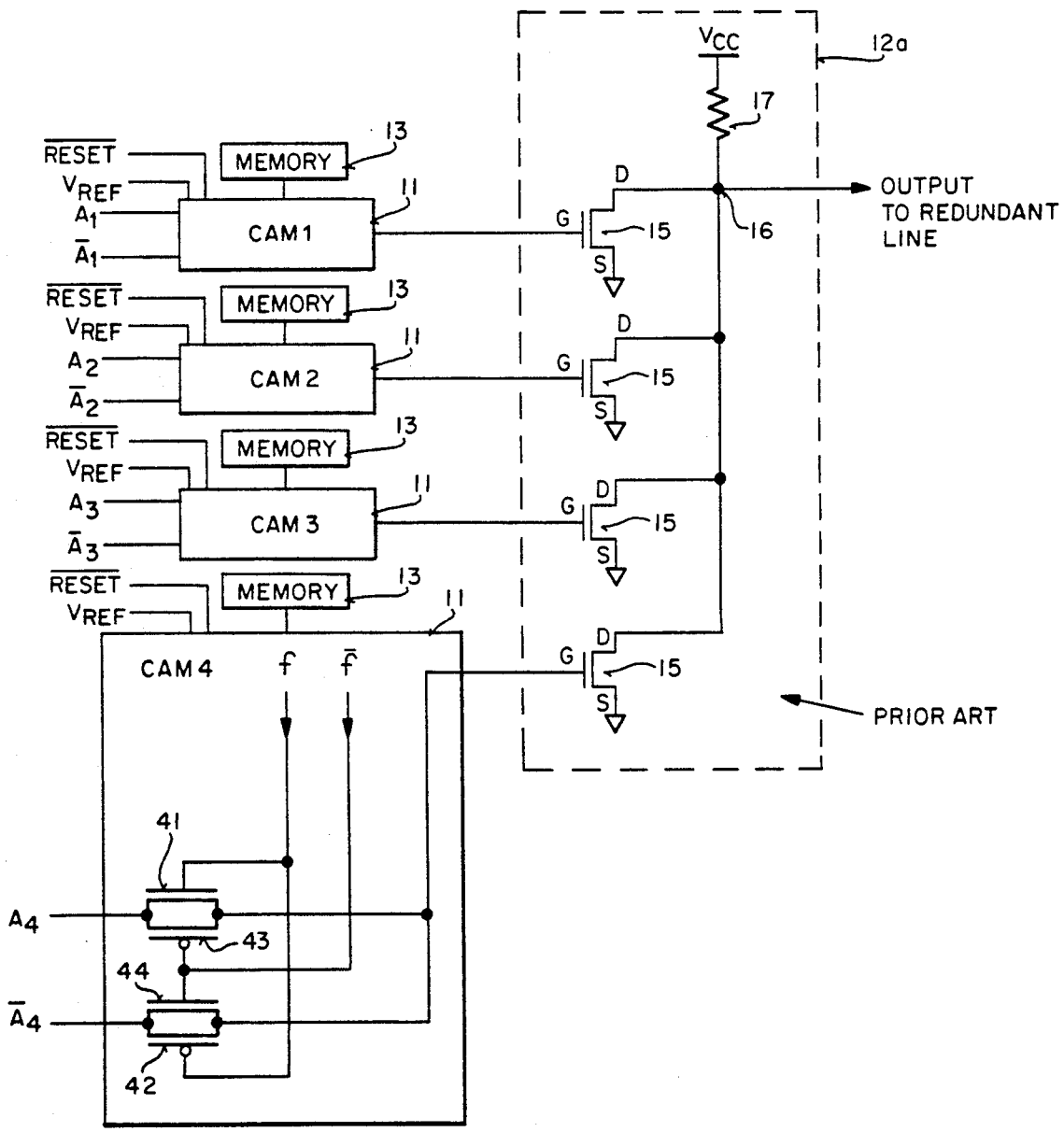

RESET CIRCUIT FOR REDUNDANT MEMORY USING CAM CELLS

BACKGROUND OF THE INVENTION

1. Field of the Invention

This invention relates to the field of memory arrays and in particular to a circuitry for providing a reset to on-chip redundant memory.

2. Prior Art

An arrayed memory, such as a random access memory (RAM) or an erasable programmable read-only-memory (EPROM), is generally comprised of an array of binary elements arranged in a matrix of rows and columns. Addresses associated with the array, access memory locations within the array. Typically, decoders are coupled to the memory to provide the decoding of the address signals. The design and manufacture of various semiconductor memories, where memory cells are arranged in an array, are well-known in the prior art.

In the manufacture of such memory arrays, processing defects often randomly occur across the memory chip. In most instances, these memory chips are fully functional except for a single or a small number of row or columns containing a defective cell. In order not to scrap a chip for having a single or a small number of defects, defect tolerant memory devices have been devised in which a redundant row and/or column of cells is substituted for a selected row and/or column containing the defective cell(s).

For example, in U.S. Pat. No. 3,659,275, a system is described in which at least one read-only-memory having permanently stored data therein is accessed in parallel with a correction redundant memory element. In U.S. Pat. No. 3,735,368 a monolithic memory is constructed of components which contain defective bit cells. U.S. Pat. Nos. 3,753,244 and 3,753,235 teach a redundancy scheme where redundancy is provided by having an extra line of cells on the chip together with a defective address store. A comparator circuit is provided for disabling a defective line of cells and replacing it with the extra line of cells in a technique of pre-wired substrates for monolithic memories. In U.S. Pat. No. 4,051,354, a fault tolerant cell addressable array having one or more superfluous rows and/or columns of cells is held in reserve. The memory chips with faulty cells are salvaged by programming the redundant memory with the cell addresses of the faulty cell locations.

More recently, a redundant memory circuit for a memory array in which the memory has a preselected number of rows or columns having addresses associated therewith and decoders coupled thereto and one or more redundant rows or columns having initially unspecified address associated therewith and redundant decoders coupled thereto is taught in U.S. Pat. No. 4,250,570. The redundant memory circuit programs the redundant decoders coupled to the redundant rows or columns having initially unspecified addresses to match the addresses of defective rows or columns having addresses associated therewith and disables one or more of the defective rows or columns having addresses associated therewith. The programming of the decoders is achieved by the use of fusible links, wherein the address decoding is achieved by open circuiting selected fusible links.

An improved addressing scheme for single chip memories which includes a plurality of redundant lines and associated cells is taught in U.S. Pat. Nos. 4,358,833 and 4,441,170. Aside from fusible links, other schemes are known in the prior art for providing the programming of the redundant decoders to provide redundancy. That is, once the defective row and/or column addresses are known, then the redundant row and/or column decoders must be programmed to replace the defective line.

Further, another scheme for providing redundancy is achieved by the use of a content addressable memory (CAM). A content addressable memory provides for storing the addresses of defective locations of the main memory array. One such defect tolerant memory system using a CAM is taught in U.S. Pat. No. 3,633,175. However, more recently semiconductor memory devices utilize redundancy schemes where the redundancy elements are similar to the cells used in the main memory. That is, for an EPROM semiconductor memory, EPROM cells are used for the redundant memory also. Instead of fusible links, actual memory cells are used to provide the programming.

In redundancy circuits using CAMs to program the redundant addresses, a reset circuit is sometimes needed to provide a resetting of the CAMs, in order to prevent false latch-up. The present invention utilizes a unique technique of using specialized CAMs to provide a reset scheme.

SUMMARY OF THE INVENTION

A reset circuit using content addressable memory (CAM) to reset CAMs associated with redundant memory is described. A half latch CAM circuit employing a single UPROM memory cell provides a function code dependent on the stored state of the UPROM. The function code coupled to an inputted address signal determines the decoding necessary for accessing redundant memory when a defective portion of a main memory is being accessed.

Because the half-latch CAM circuit is capable of latching to a wrong state if the UPROMs are programmed, a reset circuit is provided to ensure that the redundant CAMs are reset when such improper latch-up occurs. Four modified CAMs, each equivalent to the redundant CAMs, are provided. The four modified CAMs are made more sensitive than the redundant CAMs to ensure that signal conditions which cause a redundant CAM to improperly latch-up will also cause at least one modified CAM to change states. Such state change by a modified CAM will cause a reset signal to be generated by a reset generating circuit. The reset signal remains in force as long as the CAMs sense an error condition.

BRIEF DESCRIPTION OF THE DRAWINGS

FIG. 1 is a block schematic diagram showing a redundancy decoder of the present invention using CAMs.

FIG. 2 is a circuit schematic diagram showing a CAM circuit of the present invention using a UPROM cell to provide the stored logic for generating a function signal.

FIG. 3 is a block schematic diagram showing a reset circuit of the present invention.

DETAILED DESCRIPTION OF THE PRESENT INVENTION

A reset circuit for use with redundant memory cells is described. In the following description, numerous specific details, such as a specific addressing scheme, memory device, etc., are set forth in order to provide a thorough understanding of the present invention. However, it will be obvious to one skilled in the art that the present invention may be practiced without these specific details. In other instances, well-known circuits have not been described in detail in order not to unnecessarily obscure the present invention.

Referring to FIG. 1, a redundancy circuit 10 utilizing a plurality of content addressable memories (CAMs) is shown. Circuit 10 permits the selection of a redundant line, either row or column line, for the purpose of replacing a defective row or column line. An address line and its complement are coupled as inputs to each of the CAMs 11 and the output from each of the CAMs 11 is coupled as an input to a NOR gate 12. For example, address lines $A_1$ and $A_1$/(hereinafter/is used to indicate a complement) are coupled to CAM 1 which output is then coupled as an input to NOR gate 12. In the example of FIG. 1, circuit 10 is comprised of four CAM cells 1-4, each having its respective pair of input lines. It is to be appreciated that the actual number of CAMs 11, as well as the number of address lines coupled to each CAM 11, is merely a design choice. The output of the NOR gate 12 is coupled as a decoded signal for activating the redundant row or column.

Although various schemes can be used to program each of the CAMs 11, circuit 10 utilizes memory cells 13 for storing the program information for providing the decoding necessary to activate the respective redundant line. That is, once the memory array chip is manufactured and defective cells are located each of the memory cells 13 are programmed such that when the address of the defective line is presented on the address lines, the decoding provided by memory 13 and CAM 11 causes an output from NOR gate 12 for activating the redundant row or column line. Memory cells 13 will be of the type of main and redundant memory embodied in the semiconductor device. That is, if the device is an EPROM, then memory cells 13 are comprised of EPROM cells. Further, once memory cells 13 have been programmed corresponding to the defective memory line, it is typically made unerasable so that subsequent erasure of the main or redundant memory will not cause memory cells 13 to be erased. Additionally, although CAM 11 is shown having one output in the drawing of FIG. 1, however, it can be comprised of two signals, such as an output and its complement. Further, in terms of defining content addressable memory, other definitions include the memory cell 13 as an integral part of cell 11, such that the terminology defining the CAM includes both cells 13 and 11. Also, CAM cell 11 of FIG. 1 can include other decoding logic, such as XOR'ing of the address signals with the function signals f and /f.

Referring to FIG. 2, CAM 11 of the present invention is shown in circuit schematic form. Although various CAM circuits can be used for CAM 11, the preferred embodiment uses circuit 20, wherein each CAM 11 uses a single UPROM (unerasable programmable read-only-memory). UPROM cell 21 is actually an EPROM cell which is made non-erasable, so that once programmed with the decoding information for the address of the defective line, the decoding information is permanently retained. The output of the UPROM 21 is coupled through transistor 22 to node 23. Node 23 is coupled to a voltage Vcc through transistors 24 and 25. Node 23 is also coupled to Vcc by a second pair of series transistors 26 and 27. Transistors 24-27 are all p-type devices, wherein the gates of transistors 25 and 27 are grounded so that transistors 25 and 27 operate as loads for each of its respective legs. The gate of transistor 24 is coupled to receive a reset signal for resetting circuit 20.

Node 23 is coupled through inverter 28 which output is also coupled to the gate of transistor 26. The output of inverter 28 provides an f/ signal. The output of inverter 28 is also coupled through inverter 29 to provide an output signal f. The function signal f and its complement f/ provide the program decoding logic as output of CAM cell 11. UPROM 21 of FIG. 2 corresponds to the memory 13 of FIG. 1 and circuit 20 is included in CAM 11 of FIG. 1.

Transistor 22 is an n-type device having its gate coupled to a reference voltage. When $V_{REF}$ is applied, transistor 22 is activated causing UPROM 21 to be coupled to node 23. Alternatively, transistor 22 can be turned on permanently.

In operation, once defective cell locations have been determined, then the various UPROM cells are programmed or not programmed (erased) to store the logic states which are then used to provide the decoding for redundancy. The output signals f and f/ correspond to the pair of function outputs of each CAM 11, which signals f and f/ depend on its corresponding UPROM 21.

Inverters 28 and 29 provide the necessary drive for driving the pair of output lines. The single UPROM scheme of FIG. 2 saves chip area since only one UPROM cell is needed for each CAM cell. Further, it simplifies the redundancy programming modes, as well as reducing the initial standby current of the silicon, from prior art two UPROM CAMs. In operation, because the gate of the UPROM 21 is coupled to a high voltage, UPROM 21 will conduct if it is in an erased state and will not conduct if it is in a programmed state. Therefore, node 23 will correspond to a high state or a low state depending on the stored state of UPROM 21.

It is to be noted that with circuit 20, if the reset leg, comprised of transistors 24 and 25, is not present, then node 23 can be forced to either the high or the low state if UPROM 21 is programmed. That is, because of the half-latch configuration of circuit 20, using a single UPROM 21 node 23 can be forced to store an improper state when UPROM 21 is in a programmed state. A possibility of circuit 20 initializing to a wrong state can not occur when UPROM 21 is in an unprogrammed (erased) state, because node 23 is pulled low to ground.

In order to prevent node 23 from latching to the improper state when UPROM 21 is in programmed state, reset circuitry in the way of transistors 24 and 25 is provided. A reset/signal is coupled to the gate of transistor 24 to activate transistor 24 when a reset is initiated. Therefore, when UPROM 21 is in a programmed state, reset will cause node 23 to be forced to a high condition through transistors 24 and 25. By use of this reset signal, node 23 will always latch high when reset if UPROM 21 is programmed, but will latch low if UPROM 21 is erased.

Referring to FIG. 4, one technique of using a prior art scheme to provide the decoding is shown in FIG. 4. Aside from circuit 20 of FIG. 2, each CAM cell 11 includes, and is coupled to control the enablement of, a pair of CMOS input transistors for each pair of address lines. For example, signal f is coupled to the gates of transistor 41 and 42 while f/ is coupled to the gates of transistors 43 and 44. Transistors 41 and 44 are n-channel transistors while transistors 42 and 43 are p-channel transistors. Address signal $A_n$ (shown here where n=4) is coupled through the pair of transistors 41 and 43 while $A_n/$ is coupled through transistors 42 and 44. Therefore, when f is high and f/ is low, transistors 41 and 43 conduct, passing address signal $A_n$. When f is low and f/ is high, transistors 42 and 44 conduct, passing address signal $A_n/$. Therefore, depending on the stored state of its memory cell 13, each of the CAMs 11 provide appropriate f and f/ signals to its input coupling transistors 41-44, such that the proper address signal is coupled through. It is to be appreciated that although one input circuitry is shown in reference to CAM 4, each CAM 11 includes such circuitry comprised of transistors 41-44.

In FIG. 4, a prior art NOR gate 12a is shown comprised of a plurality of n-channel transistors 15 having their drains coupled to an output node 16. Node 16 is tied to a voltage, such as Vcc, through a load 17. The sources of each of the transistors 15 are coupled to ground while each of the gates are coupled to its respective CAM 11, which outputs $A_n$ or $A_n/$ depending on its function signals. Logically NOR gate 12a provides the NOR function as NOR gate 12 of FIG. 1. It is to be noted that the entirety of circuits 11 and 12a in FIG. 4 comprise a XOR function with respect to inputs f and $A_n$, and their complements.

Referring to FIG. 3, a reset scheme of the present invention utilizing modified CAMs is shown. The reset scheme of the present invention is comprised of four modified CAMs 31, 32, 33 and 34, which have each of the outputs coupled to a gate for driving a pulse generator to generate the reset signal. The four modified CAMs 31-34 are each equivalent to the CAM circuit 20 of FIG. 2. Each UPROM cell 21 for CAMs 31-34 can be used as shown in FIG. 2 if in the programmed state, or in the alternative, UPROM 21 can be disconnected to float the source of transistor 22 to simulate a programmed cell. The outputs of each of the CAMs 31-34 are coupled as an input to a NOR gate 35 which output is then coupled through an inverter 36 to a pulse generator 37. It is to be appreciated that various other gate combinations can be used, instead of gate 35 and inverter 36 for the purpose of initializing pulse generator 37. Pulse generator 37 when activated causes a reset signal to be generated on reset line 38. The reset signal is coupled to the CAMs of the redundancy circuit (shown as CAMs 1-4), as well as to the modified CAMs 31-34. It is appreciated that any number of CAMs, as are necessary for implementing redundancy, can be used and that the four CAM's are shown as an example.

The reset signal RST/ is generated by the operation of the four modified CAM cells 31-34. Modified CAMs 31-34 are identical to the redundancy CAMs 11 except that UPROM 21 has been disconnected from transistor 22. The disconnection of UPROM 21 from circuit 20 simulates a program state such that node 23 can be latched to the wrong state. However, each of these CAMs 31-34 are modified further so that combined they are more sensitive to circuit variations and noise than are CAMs 1-4. Therefore, conditions which may cause the latching of the wrong state in the redundancy CAMs will necessarily cause the modified CAMs 31-34 to change states. The sensitivity of CAMs 31-34 is for these CAMs 31-34 to have one or more of the nodes 23 of CAMs 31-34 to transition to a low state, thereby generating a reset pulse, whenever conditions are present which might cause any of the redundancy CAMs to latch-up to the wrong state. Although four CAMs 31-34 are shown in the preferred embodiment, the actual number to be used can vary and in a matter of design choice in implementing the present invention.

CAM 31 is modified from the redundancy CAMs 11 by having a smaller capacitor coupled to Vcc while a second CAM 32 has a larger capacitor coupled to Vss than the redundancy CAMs 11. The third and fourth CAMs 33 and 34 are identical to the redundancy CAMs 11, except that CAM 34 is flipped in layout with respect to CAM 33 since such flippings also occurs in redundancy CAMs 11. The two CAMs, having the modified capacitors coupled to Vcc and to Vss, allow for voltage fluctuations, or glitches, coupled to Vcc or Vss to be sensed faster by CAMs 31 and 32, such that these CAMs respond to these glitches at a faster rate than the redundancy CAMs 11. In the preferred embodiment, these modified capacitors are coupled between node 23 and Vcc or Vss, because node 23 is particularly sensitive to noise. It is to be appreciated that other noise/glitch sensitive circuits or devices can be implemented to make the CAMs sensitive. CAMs 33 and 34 are used to duplicate the redundancy CAMs 11.

During an initial power up sequence, or if a glitch is present on any signal line that may cause the wrong state to be latched by the redundancy CAMs 11, the dummy latches in the form of CAMs 31-34 will necessarily also be forced to switch because of their higher sensitivity to these voltage and signal variations. If any combination of the dummy latches are forced to switch, a NOR gate 35 changes its state, thereby activating pulse generator 37 which generates the reset signal. The reset signal resets the redundancy CAMs 11 as well as the modified CAMs 31-34. This reset signal, as stated earlier in reference to FIG. 2, causes circuit 20 to reset and ensures that node 23 is brought to the proper state. When the modified CAMs 31-34 have been reset, each of their respective nodes 23 is pulled high causing the reset signal to be turned off. However, the reset signal will remain active as long as, or as often as, the offending condition exists which causes a possibility for any of the redundancy CAMs to have an improper state. Further, this self-timing feature also prevents the large current surges during power up sequences associated with reset signal schemes of the prior art. As to the pulse generator 37, a variety of prior art pulse generator circuits can be used. The preferred embodiment uses a logic gate, such as a NOR gate, and a series of inverters coupled to one input of the gate. The input is applied to the first of the inverters as well as to the second input of the gate. The inverters operate as a delay element causing a pulse to be generated at the output of the gate.

Further, in the preferred embodiment, a specialized NOR decoding is utilized for NOR gates 12 and 35, wherein circuit 20 is used to control the passing of address signals through the respective CAMs 11 for decoding purposes. This NOR decoding circuit is described in a copending application U.S. Ser. No. 07/309320, filed 2-10-89, entitled "Redundancy Decoding Circuit Using N-Channel Transistors," and is hereby incorporated by reference.

Additionally, it is to be noted that the circuit of the present invention, as well as the redundant memory and its associated circuitry, are embodied in an integrated circuit chip containing the main memory.

I claim:

1. In a decoding scheme for redundant memory which includes a first content addressable memory (CAM) for decoding an address signal to access locations in said redundant memory, a reset circuit for resetting said first CAM, comprising:
- a second content addressable memory (CAM) configured to provide a state change at its output, wherein when voltage fluctuations which cause said first CAM to falsely latch-up are present, said second CAM will also be affected by said voltage fluctuations and will be forced to latch-up causing an output state change; and
- reset generation means for providing a reset signal to said first CAM and for detecting said output state change of said second CAM, said reset generation means communicatively coupled to receive said output state change from said second CAM and said reset generation means also communicatively coupled to said first CAM such that when said output state change is detected said reset signal causes said first CAM to be reset to prevent false latch-up by said first CAM.

2. The reset circuit of claim 1 wherein said reset signal is also coupled to reset said second CAM.

3. The reset circuit of claim 1 wherein said reset signal is also coupled to reset said second CAM, but said second CAM continues to provide said output state change as long as said false latch-up condition persists.

4. The reset circuit of claim 2 wherein said second CAM is made more sensitive to false latch-up conditions than said first CAM to ensure said second CAM to change its output state when said false latch-up condition occurs.

5. The reset circuit of claim 3 wherein said second CAM is made more sensitive to false latch-up conditions than said first CAM to ensure said second CAM to change its output state when said false latch-up condition occurs.

6. In a decoding scheme for a redundant memory which includes a plurality of first content addressable memories (CAMs) for decoding address signals to access locations in said redundant memory and wherein said first CAMs can falsely latch-up under voltage fluctuations or glitches, a reset circuit for resetting said first CAMs, comprising:
- a plurality of second CAMs, each configured to provide a state change at its output, wherein when said voltage fluctuations or glitches which cause said first CAMs to falsely latch-up occur, at least one of said second CAMs will also be forced to latch-up causing an output state change;
- gating means for providing a gated output when any one of said second CAMs generates said output state change, said gating means communicatively coupled to receive outputs from said plurality of second CAMs; and
- pulse generation means coupled to receive said gated output from said gating means and generating a reset pulse of a predetermined duration which is coupled to reset said first CAMs to prevent false latch-up by said first CAMs.

7. The reset circuit of claim 6 wherein said reset pulse is also coupled to reset said second CAMs.

8. The reset circuit of claim 6 wherein said reset pulse is also coupled to reset said second CAMs, but corresponding ones of said second CAMs continue to provide said output state changes as long as said false latch-up condition persists.

9. The reset circuit of claim 7 wherein some of said second CAMs are made more sensitive than said first CAMs to voltage glitches which cause false latch-up conditions to ensure at least one of said second CAMs to change its output state when said false latch-up condition occurs.

10. The reset circuit of claim 8 wherein said second CAMs are comprised of four separate CAMs, two of said second CAMs are made more sensitive to false latch-up conditions than said first CAMs to ensure at least one of said second CAMs to change its output state when said false latch-up condition occurs.

11. The reset circuit of claim 10 wherein two of said second CAMs are made more sensitive by having a smaller capacitor coupled to Vcc in one of said two CAMs and a larger capacitor coupled to Vss in the other of said two CAMs, said larger capacitor being larger in value than equivalent capacitors coupled to Vss in said first CAMs and said smaller capacitor being smaller in value than equivalent capacitors coupled to Vcc in said first CAMs.

* * * * *